United States Patent [19]

Hiiro

[11] Patent Number: 5,404,365
[45] Date of Patent: Apr. 4, 1995

[54] POLARIZED LIGHT COHERENT COMBINING LASER APPARATUS

[75] Inventor: Hiroyuki Hiiro, Kanagawa, Japan

[73] Assignee: Fuji Photo Film Co., Ltd., Kanagawa, Japan

[21] Appl. No.: 280,832

[22] Filed: Jul. 26, 1994

[30] Foreign Application Priority Data

Jul. 30, 1993 [JP] Japan .................................. 5-189785

[51] Int. Cl.$^6$ ............................................. H01S 3/10
[52] U.S. Cl. ............................................. 372/27; 372/106
[58] Field of Search .......................... 372/18, 19, 27, 43, 372/71, 106

[56] References Cited

U.S. PATENT DOCUMENTS 4,293,202 10/1981 Ohnishi et al. ........................... 354/5
5,048,030 9/1991 Hiiro ...................................... 372/106

OTHER PUBLICATIONS

*Optics Letters*, vol. 11, No. 5, May 1986, pp. 303–305; Veldcamp et al; "Coherent Summation of Laser Beams Using Binary Phase Gratings".

*Primary Examiner*—Rodney B. Bovernick
*Assistant Examiner*—Robert E. Wise

[57] ABSTRACT

A polarized light coherent combining laser apparatus comprises a plurality of units, each of which is constituted of a polarizing element and a phase difference plate. A phase difference and an angle of inclination of principal axes of the phase difference plate of each unit is set so as to satisfy specific conditions in accordance with the intensity ratio between an S-polarized laser beam and a P-polarized laser beam, which impinge upon each unit. The P-and S-polarized laser beams impinging upon each unit are combined with each other by the polarizing element. The plane of polarization of the combined laser beam is rotated by the phase difference plate, and the resulting laser beam impinges upon the next unit. The laser beam having been radiated out of the last unit passes through an analyzer, is reflected by a reflecting surface of a radiating mirror, and again impinges upon each unit. The laser beams having again impinged upon the units are then reflected by mirror surfaces of amplifying media. The laser beams are thus repeatedly reflected between the mirror surfaces of the amplifying media and the reflecting surface of the radiating mirror, and the P- and S-polarized laser beams are thereby combined coherently.

3 Claims, 5 Drawing Sheets

POLARIZED LIGHT COHERENT COMBINING LASER APPARATUS

BACKGROUND OF THE INVENTION

1. Field of the Invention

This invention relates to a polarized light coherent combining laser apparatus. This invention particularly relates to a polarized light coherent combining laser apparatus, which is capable of combining a plurality of laser beams with one another and thereby obtaining a combined laser beam having a high energy.

2. Description of the Prior Art

As an apparatus for recording information, such as characters, on a recording material by utilizing a light beam, a laser computer output microfilmer (hereinafter referred to as a laser COM) has heretofore been proposed. With the laser COM, a laser beam is scanned in accordance with the information fed out of a computer, and the information, such as characters, is thereby directly recorded on a recording material, such as a microfilm. (The laser COM is described in, for example, U.S. Pat. No. 4,293,202, issued Oct. 6, 1981.) The laser COM comprises an argon laser for producing a laser beam, an optical modulator for optically modulating the laser beam in accordance with the information, which represents characters, or the like, a rotating polygon mirror for deflecting the laser bream, which has been modulated by the optical modulator, in a main scanning direction, and a galvanometer mirror provided with a deflecting mirror for deflecting the laser beam, which has been reflected by the rotating polygon mirror, in a sub-scanning direction. With the combination of the rotating polygon mirror and the galvanometer mirror, the laser beam, which has been radiated out of the optical modulator, is two-dimensionally scanned on the recording material via a scanning lens. In this manner, the information, such as characters, is recorded on the recording material.

The laser COM described above utilizes the argon laser, which cannot be subjected to on/off control, and therefore it is necessary to provide the optical modulator. Accordingly, it has recently been proposed to utilize a semiconductor laser in lieu of the argon laser. However, in cases where semiconductor lasers are caused to oscillate continuously, the output power of the semiconductor lasers is as small as several milliwatts to several tens of milliwatts. Therefore, it is difficult for the semiconductor lasers to be applied to recording materials, which require a laser beam having a high energy, e.g., heat mode recording materials, such as laser direct recording films (LDFs).

Also, a technique for coherently combining the laser beams, which have been produced by a plurality of lasers, with one another by use of a diffraction grating and thereby producing a laser beam in a single polarized state has been disclosed in, for example, OPTICS LETTERS/Vol. 11, No. 5/May 1986.

However, the disclosed technique has the problems described below. Specifically, with the technique wherein the laser beams are combined with one another by using the diffraction grating, it is difficult to design the grooved surface configuration of the grating such that the direction of diffraction may coincide with a predetermined direction. Also, only the zero-order diffracted light component should be passed through an aperture, and the laser beams having been diffracted in nonessential directions should be blocked. Therefore, the efficiency of the optical system cannot be kept high.

Further, the laser beams, which have been produced by two semiconductor lasers, have heretofore been combined with each other by a polarizing beam splitter. However, the combined laser beam contains a P-polarized light component, which oscillates parallel to the plane of incidence upon the polarizing beam splitter, and an S-polarized light component, which oscillates in the direction normal to the plane of incidence upon the polarizing beam splitter. Therefore, if a polarizing element is located in the optical path of the combined laser beam, one half of the amount of light cannot pass through the polarizing element.

Accordingly, the applicant proposed a light amplifying device, which has a simple construction and can efficiently radiate out a laser beam having a high energy, in U.S. Pat. No. 5,048,030.

The proposed light amplifying device comprises:
i) an optical resonator constituted by first and second reflecting mirrors and a common reflecting mirror, which are located in optically opposite relation to each other, the common reflecting mirror having a reflectivity smaller than the reflectivities of the first and second reflecting mirrors,
ii) an optical path changing means, which is located between the first and second reflecting mirrors and the common reflecting mirror for making the laser beams incoming from a side of the common reflecting mirror emerge in a direction toward at least one of the first and second reflecting mirrors corresponding to either direction of an orthogonal plane of polarization, and for making laser beams incoming from the sides of the first and second reflecting mirrors incident upon the common reflecting mirror,
iii) first and second amplifying media, which are located in optical paths of the laser beams between the first and second reflecting mirrors and the optical path changing means, respectively, for amplifying the laser beams through the process of stimulated emission, and
iv) an optical element, which is located between the common reflecting mirror and the optical path changing means such that the optical element may be capable of transmitting the laser beams therethrough, and which rotates the plane of polarization of the laser beam having been reflected by the common reflecting mirror by a predetermined angle with respect to the plane of polarization of the laser beam coming from the optical path changing means.

With the proposed light amplifying device, the optical path changing means is located between the first and second reflecting mirrors and the common reflecting mirror, which are located in optically opposite relation to each other and which jointly constitute the optical resonator. The optical path changing means makes a laser beam incoming from the side of the common reflecting mirror emerge in a direction toward at least one of the first and second reflecting mirrors corresponding to either direction of the orthogonal planes of polarization. Also, the optical path changing means makes the laser beams incoming from the sides of the first and second reflecting mirrors incident upon the common reflecting mirror. The first and second amplifying media are located in optical paths of the laser beams between the optical path changing means and the first and second reflecting mirrors, respectively. Therefore, the laser beams coming from the optical path changing means are amplified through the respective amplifying media and then reflected by the first and second reflecting mirrors. Thereafter, the reflected laser beams are amplified again by the amplifying media and impinge upon the common reflecting mirror via the optical path changing means. The optical element is located between the common reflecting mirror and the optical path changing means. The optical element rotates the plane of polarization of the laser beam, which has been reflected by the common reflecting mirror, by a predetermined angle with respect to the plane of polarization of the laser beam coming from the optical path changing means. The direction of the optical path of the laser beam, which has passed through the optical element and again enters the optical path changing means, is changed to the direction toward at least one of the first and second reflecting mirrors in accordance with the direction of the plane of polarization of the laser beam having been rotated by the optical element. In this manner, the laser beam is caused to impinge upon the respective amplifying media.

In cases where the polarized light beams having the planes of polarization orthogonal to each other are P-polarized light and S-polarized light, the optical element serves to convert part or the whole of the P-polarized light into the S-polarized light and serves to convert part or the whole of the S-polarized light into the P-polarized light during the repeated reflection cycles of the polarized laser beams. Therefore, the optical resonator, which is constituted of the first reflecting mirror, the common reflecting mirror, and the amplifying medium located therebetween, and the optical resonator, which is constituted of the second reflecting mirror, the common reflecting mirror, and the amplifying medium located therebetween, jointly constitute a single united resonator, and the P-polarized light and the S-polarized light are thereby coherently combined with each other. Therefore, the P-polarized light and the S-polarized light are unified into a laser beam, which has a high energy and is in a single polarized state. In cases where the laser beams to be combined together have a phase difference therebetween, elliptically polarized light will ordinarily be obtained. In such cases, a combined laser beam in a single linearly polarized state can be obtained by compensating for the phase difference with a wavelength plate, or the like.

However, with the light amplifying device proposed in U.S. Pat. No. 5,048,030, only two laser beams can be combined with each other. This publication shows nothing about a configuration for combining a plurality of (i.e., three or more) laser beams with one another. Therefore, with the proposed light amplifying device, a laser beam having a high energy cannot be obtained by coherently combining a plurality of laser beams.

SUMMARY OF THE INVENTION

The primary object of the present invention is to provide a polarized light coherent combining laser apparatus, which is capable of combining a plurality of (i.e., three or more) laser beams with one another and thereby obtaining a combined laser beam having a high energy.

Another object of the present invention is to provide a polarized light coherent combining laser apparatus, which has a simple construction and yields a combined laser beam having a high energy.

The present invention provides a polarized light coherent combining laser apparatus, comprising:
i) a plurality of units, each of which comprises:
  a) a polarizing element for combining a P-polarized laser beam and an S-polarized laser beam, which impinge upon the polarizing element and have a predetermined intensity ratio with respect to each other, with each other into a single combined laser beam and radiating out the combined laser beam,
  the polarizing element also splitting a single laser beam, which impinges upon the polarizing element from a direction reverse to the direction along which the single combined laser beam was radiated out of the polarizing element, into a P-polarized laser beam and an S-polarized laser beam and radiating out the split P-polarized and S-polarized laser beams respectively in directions reverse to the directions, along which the two laser beams to be combined with each other by the polarizing element impinged upon the polarizing element, and
  b) a phase difference plate, which is located in the optical path of the single combined laser beam having been radiated out of the polarizing element, and which has a phase difference in accordance with the intensity ratio of the S-polarized laser beam impinging upon the polarizing element to the P-polarized laser beam impinging upon the polarizing element and has principal axes inclined by a predetermined angle with respect to the P-polarized laser beam and the S-polarized laser beam,
the plurality of the units being located such that a laser beam having been radiated out of each unit may impinge upon the polarizing element of a unit, which is located at the next stage, together with the other laser beam, which is to be combined with the laser beam having been radiated out of each unit,
ii) an analyzer, which is located in the optical path of the laser beam having been radiated out of a unit at a last stage among the plurality of the units, and which transmits a predetermined polarized light component of the laser beam having been radiated out of the unit at the last stage,
iii) a radiating reflecting mirror for reflecting the laser beam, which has been radiated out of the analyzer, in a predetermined proportion,
iv) amplifying media for amplifying incident laser beams, each of the amplifying media being located in the optical path of a laser beam, which is one of the laser beams impinging upon each of the plurality of the units and which is other than the laser beam coming from a preceding unit, and
v) reflecting mirrors respectively provided on the amplifying media, each of the reflecting mirrors reflecting the laser beam, which has been reflected by the radiating reflecting mirror to the corresponding amplifying medium and has then passed through the corresponding amplifying medium, in a direction heading towards the radiating reflecting mirror,
the phase difference and the angle of inclination of the principal axes of the phase difference plate of each unit being set such that, in cases where $0 < |\alpha_i| < \pi/2$ and $\delta_i \pm m_i \cdot \pi/2$, wherein $\alpha_i$ represents the angle of inclination of the principal axes of the phase difference plate of an i'th unit, as counted from the unit at the first stage among the plurality of the units, $\delta_i$ represents the phase difference of the phase difference plate of the i'th unit, and $m_i$ is an integer, the angle of inclination $\alpha_i$ of the principal axes and the phase difference $\delta_i$ satisfy the conditions $$\phi_i = \tan^{-1}\sqrt{C_i}$$

$$\alpha_i = \phi_i + m_i \cdot \pi/2$$

where $m_i=2n_i$ ($n_i$: an integer) for a configuration, in which the polarizing element at the next stage transmits a P-polarized laser beam having been radiated out of the i'th unit and combines it with the other laser beam, and $m_i=2n_i+1$ (ni: an integer) for a configuration, in which the polarizing element at the next stage reflects an S-polarized laser beam having been radiated out of the i'th unit and combines it with the other laser beam,
and $$\cos 2\delta_i = \tan \alpha_i/\tan 2\phi_i$$

wherein $C_i$ represents the intensity ratio $Is_i/Ip_i$, $Is_i$ represents the intensity of the S-polarized laser beam impinging upon the i'th unit, and $Ip_i$ represents the intensity of the P-polarized laser beam impinging upon the i'th unit.

With the polarized light coherent combining laser apparatus in accordance with the present invention, each of the plurality of units is constituted of the polarizing element and the phase difference plate, which has the predetermined phase difference and the predetermined angle of inclination of the principal axes. The plurality of the units are located such that the laser beam having been radiated out of each unit may impinge upon the polarizing element of a unit, which is located at the next stage, together with the other laser beam, which is to be combined with the laser beam having been radiated out of each unit. The analyzer and the radiating reflecting mirror are located in the optical path of the laser beam, which has been radiated out of the unit at the last stage. Each unit is provided with the amplifying medium, which amplifies an incident laser beam, and the reflecting mirror, which is provided on the amplifying medium. The reflecting mirror reflects the laser beam, which has been reflected by the radiating reflecting mirror to the amplifying medium and has then passed through the amplifying medium, in the direction heading towards the radiating reflecting mirror.

The polarizing element combines the P-polarized laser beam and the S-polarized laser beam, which impinge upon the polarizing element, with each other into a single combined laser beam and radiates out the combined laser beam. The polarizing element also splits a single laser beam, which impinges upon the polarizing element from a direction reverse to the direction along which the single combined laser beam was radiated out of the polarizing element, into a P-polarized laser beam and an S-polarized laser beam and radiates out the split P-polarized and S-polarized laser beams respectively in directions reverse to the directions, along which the two laser beams to be combined with each other by the polarizing element impinged upon the polarizing element. The P-polarized light component and the S-polarized light component of the single combined laser beam, which has been radiated out of the polarizing element, are then imparted with a predetermined phase lag therebetween, and the resulting laser beam impinges upon the polarizing element of the unit at the next stage.

The laser beam, which has been obtained in the manner described above, and a laser beam, which has been produced by a different unit or a different laser beam source, impinge upon the polarizing element of the unit at the next stage. The two laser beams are combined with each other into a single combined laser beam in the same manner as that described above. The P-polarized light component and the S-polarized light component of the single combined laser beam, which has been radiated out of the polarizing element, are then imparted with a predetermined phase lag therebetween.

The processes described above are carried out in each unit. A predetermined polarized light component of the laser beam, which has been radiated out of the unit at the last stage, passes through the analyzer and is then reflected by the radiating reflecting mirror. Thereafter, a predetermined polarized light component passes through the analyzer and impinges reversely upon the unit at the last stage. After the laser beam has thus impinged reversely upon the unit at the last stage, the plane of polarization of the laser beam is rotated by a predetermined angle by the phase difference plate of each unit. Also, the laser beam is Split by the polarizing element of each unit into a P-polarized laser beam and an S-polarized laser beam. The Split laser beams respectively impinge upon the preceding unit and the amplifying medium. The plane of polarization of the laser beam, which has thus impinged upon the preceding unit, is rotated by the phase difference plate of the unit, and the laser beam is split by the polarizing element of the unit into two laser beams.

As will be described later, the phase difference plate has a phase difference in accordance with the intensity ratio of the incident S-polarized laser beam to the incident P-polarized laser beam and has a predetermined angle of inclination of the principal axes. In such cases, part or the whole of the P-polarized light of the laser beam having reversely impinged upon the polarizing element is converted into the S-polarized light, and part or the whole of the S-polarized light is converted into the P-polarized light during the repeated reflection cycles between the radiating reflecting mirror and the reflecting mirror, which is located in each unit. Therefore, the radiating reflecting mirror, the reflecting mirror of each unit, and the amplifying medium located therebetween jointly constitute a resonator, and the P-polarized light and the S-polarized light are thereby coherently combined with each other. Therefore, in cases where the phase difference and the rotation angle of the principal axes of the phase difference plate are set at predetermined values, the laser beams impinging upon the respective units are unified into a laser beam, which has a high energy and is in a single polarized state. In this manner, a laser beam having a high energy can be obtained with a simple configuration.

DESCRIPTION OF THE PREFERRED EMBODIMENTS

The present invention will hereinbelow be described in further detail with reference to the accompanying drawings.

Figure 1:
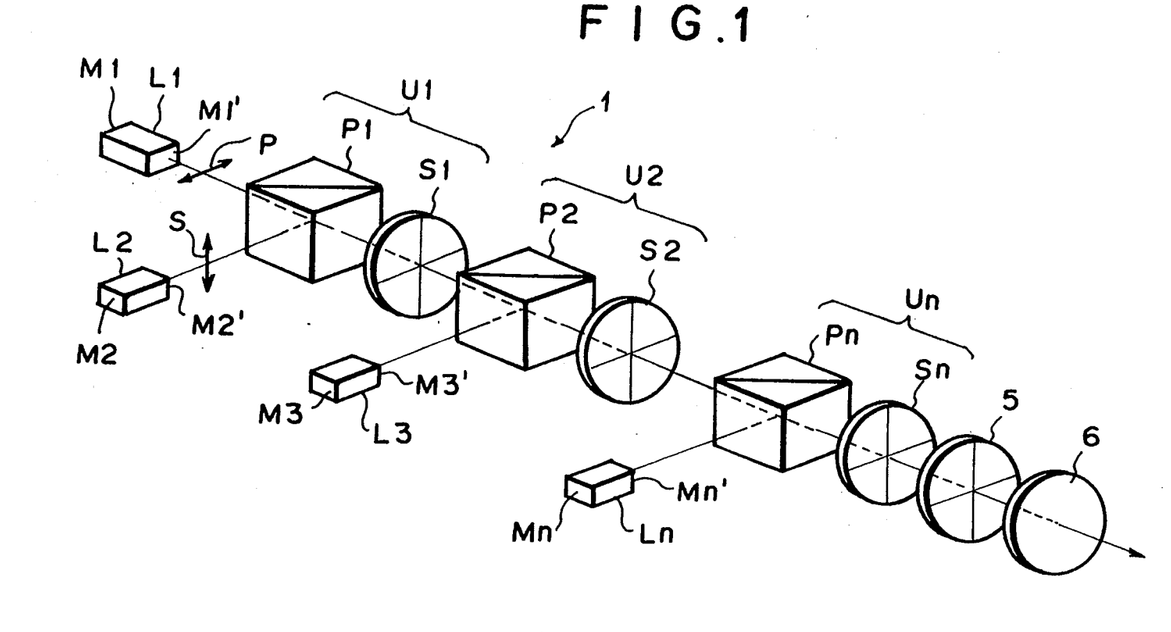
FIG. 1 is a perspective view showing a first embodiment of the polarized light coherent combining laser apparatus in accordance with the present invention.

FIG. 1 is a perspective view showing a first embodiment of the polarized light coherent combining laser apparatus in accordance with the present invention. In this embodiment, semiconductor lasers are employed as the amplifying media, and polarizing beam splitters are employed as the polarizing elements.

The first embodiment of the polarized light coherent combining laser apparatus in accordance with the present invention comprises a plurality of units. How each unit is constructed will be described hereinbelow.

Figure 2:
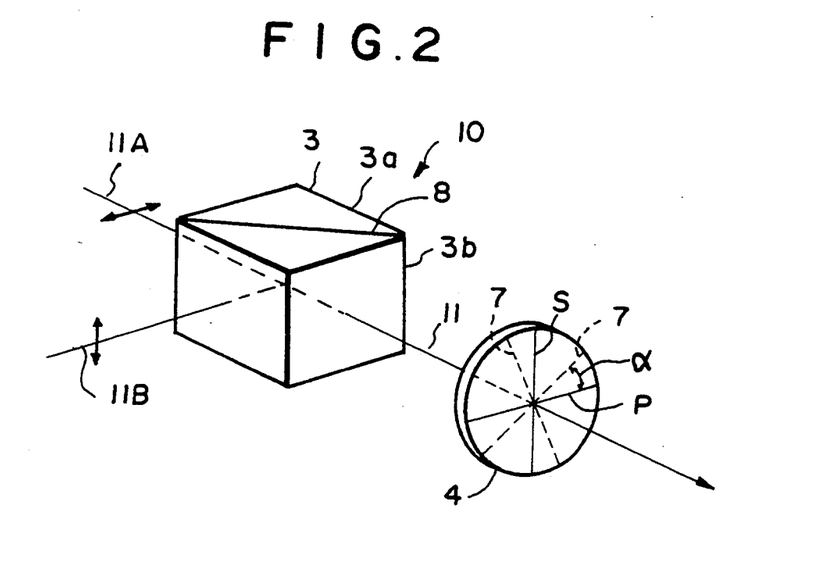
FIG. 2 is a perspective view showing a unit, which constitutes the first embodiment of the polarized light coherent combining laser apparatus in accordance with the present invention.

FIG. 2 is a perspective view showing a unit, which constitutes the first embodiment of the polarized light coherent combining laser apparatus in accordance with the present invention. As illustrated in FIG. 2, a unit 10 comprises a polarizing beam splitter 3 and a phase difference plate 4. The polarizing beam splitter 3 is constructed by forming an alternating multi-layer film 8, which is composed of a material having a high refractive index and a material having a low refractive index, with a vacuum evaporation process on each of oblique surfaces of two 45° rectangular prisms $3a$ and $3b$, and then adhering the oblique surfaces of the two 45° rectangular prisms $3a$ and $3b$ to each other.

The phase difference plate 4 has a phase difference $\delta$ in accordance with the intensity ratio of the S-polarized light component to the P-polarized light component of a laser beam 11 impinging upon the phase difference plate 4. The phase difference plate 4 also has principal axes 7, 7 inclined by a predetermined angle $\alpha$ with respect to P-polarized laser beam 11A and S-polarized laser beam 11B. How the phase difference $\delta$ and the predetermined angle $\alpha$ are set will be described hereinbelow.

Figure 3:
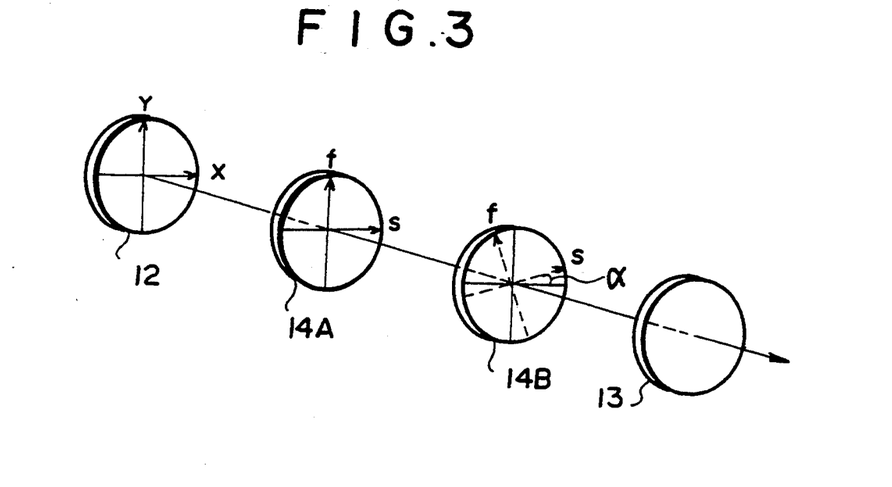
FIG. 3 is a perspective view showing a configuration of a resonator, which generalizes a twist mode.

First, it is considered to combine two laser beams, which have different intensities, with each other. Also, a configuration of a resonator, which is shown in FIG. 3 and generalizes a twist mode, is considered. Calculations are then carried out to find conditions, under which a eigen mode can exist so as to obtain a linearly polarized light having a predetermined azimuthal angle with respect to the principal axes of the phase difference plate in contact with the end face of a mirror 12. In FIG. 3, each of two phase difference plates 14A and 14B is constituted of a $\lambda\delta/\pi$ plate. Also, the angle of rotation between the first phase difference plate 14A and the second phase difference plate 14B is equal to $\alpha$.

In general, the eigen mode of the resonator can be calculated as a eigen vector V of a eigen equation $$JV = \lambda V \quad V = \begin{pmatrix} Vx \\ Vy \end{pmatrix} \tag{1}$$

In this case, the (x,y) coordinate system is considered as being fixed such that the x axis may coincide with the s axis of the principal axes of the first $\lambda\delta/\pi$ plate 14A. In Formula (1), J is a $2\times2$ Jones matrix representing one round trip of the resonator, and V is an electric field vector. The Jones matrix J can be calculated with Formula (2).

$$J = M \times P \times R(\alpha) \times P \times M \times P \times R(\alpha) \times P \tag{2}$$

$$= \begin{pmatrix} J_{11} & J_{12} \\ J_{21} & J_{22} \end{pmatrix} = \begin{pmatrix} J_{11} & J_{12} \\ J_{12} & J_{11}^* \end{pmatrix}$$

$$= \begin{pmatrix} e^{-i4\delta}\cos^2(\alpha) + \sin^2(\alpha) & -i \cdot \sin(2\delta)\sin(2\alpha) \\ -i \cdot \sin(2\delta)\sin(2\alpha) & e^{i4\delta}\cos^2(\alpha) + \sin^2(\alpha) \end{pmatrix}$$

In Formula (2), as will be shown below, P represents the Jones matrix of the phase difference plate, $R(\alpha)$ represents the coordinate rotation matrix, and M represents the sign inversion matrix at the time of reflection.

$$P = \begin{pmatrix} e^{-i\delta} & 0 \\ 0 & e^{i\delta} \end{pmatrix} R(\alpha) = \begin{pmatrix} \cos(\alpha) & \sin(\alpha) \\ -\sin(\alpha) & \cos(\alpha) \end{pmatrix} M = \begin{pmatrix} -1 & 0 \\ 0 & 1 \end{pmatrix}$$

An eigen value $\lambda$ in the eigen equation of Formula (1) can be calculated from the Jones matrix J by solving a eigen value $$\begin{vmatrix} J_{11} - \lambda & J_{12} \\ J_{21} & J_{22} - \lambda \end{vmatrix} = \lambda^2 - (J_1 + J_{22})\lambda + J_{11}J_{22} - J_{12}J_{21} = 0 \tag{3}$$

From Formula (3), the eigen value $\lambda$ has two solutions shown below.

$$\lambda \frac{1}{2} \{(J_1 + J_{22}) \pm \sqrt{(J_{11} + J_{22})^2 - 4(J_{11}J_{22} - J_{12}J_{21})}\} = \tag{4}$$

$$\sin^2(\alpha) + \cos(4\delta)\cos^2(\alpha) \pm$$

$$i \cdot 2\sin(2\delta)\cos(\alpha)\sqrt{1 - \sin^2(2\delta)\cos^2(\alpha)}$$

In this case, $J_{11} - \lambda$ can be expressed with Formula (5).

$$J_{11} - \lambda = -i \cdot 2\sin(2\delta)\cos(\alpha)\{\cos(2\delta)\cos(\alpha) \pm \tag{5}$$

-continued $$\sqrt{1 - \sin^2(2\delta)\cos^2(\alpha)} \}$$

The eigen vector can be calculated by solving the eigen equation shown below with respect to the eigen value $\lambda$.

$$(J_{11}-\lambda)V_x + J_{12}V_y = 0$$

$$J_{21}V_x + (J_{22}-\lambda)V_y = 0 \quad (6)$$

How the eigen vector is derived will be described hereinbelow. In this case, the azimuthal angle is limited to the range shown below.

$$-\pi/2 < \alpha, \phi \leq \pi/2$$

First, the cases, wherein $J_{12} = -i.\sin(2\alpha)\sin(2\delta) \neq 0$, are considered. Such conditions are satisfied in the cases shown below.

(1) $0 < |\alpha| < \pi/2$ and $\delta \neq m.\pi/2$ (m: an integer) In such cases, the ratio between the orthogonal components of the eigen vector can be calculated with the formula shown below.

$$\frac{V_y}{V_x} = -\left(\frac{\cos(2\delta)\cos(\alpha) \pm \sqrt{1-\sin^2(2\delta)\cos^2(\alpha)}}{\sin(\alpha)}\right) \quad (7)$$

The ratio between the orthogonal components of the eigen vector is a real number, and therefore the eigen vector is the linearly polarized light. In order for the eigen vector to become a vector having a predetermined azimuthal angle $\phi$ with respect to the x axis, the conditions shown below should be satisfied.

$$-\left(\frac{\cos(2\delta)\cos(\alpha) \pm \sqrt{1-\sin^2(2\delta)\cos^2(\alpha)}}{\sin(\alpha)}\right) = \tan(\phi) \quad (8)$$

Solving Formula (8) gives the conditional formula $$\cos(2\delta) = \frac{\tan(\alpha)}{\tan(2\phi)} \quad (9)$$

Figure 4:
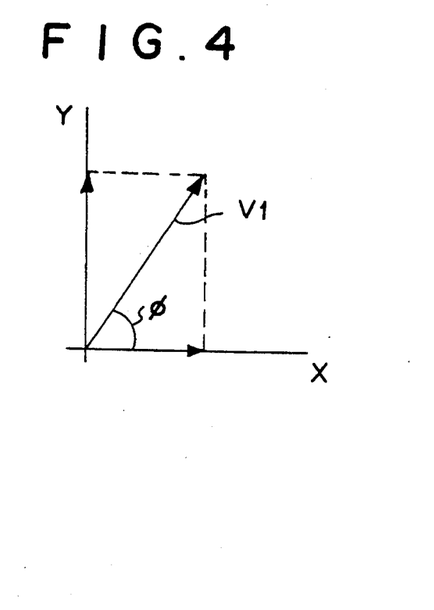
FIG. 4 is a graph showing a eigen vector.

Therefore, as illustrated in FIG. 4, if the phase difference plate satisfying Formula (9) is set, the vector having the predetermined azimuthal angle $\phi$ becomes the eigen vector. There are two independent parameters ($\alpha$ and $\delta$) of the phase difference plate satisfying Formula (9). Therefore, infinitely many ways of setting of the phase difference plate satisfying Formula (9) are possible. For example, in cases where $\phi = \pm\pi/4$, $\tan(2\phi) = \infty$, and therefore $\delta$ must take a value of Formula (10) such that Formula (9) may be satisfied. In this case, $\alpha$ can take an arbitrary value.

$$\delta = (2n+1).\pi/4 \text{ (n: an integer)} \quad (10)$$

Then, the cases, wherein $J_{12} = J_{11} - \lambda = 0$ ($\alpha \neq 0$), are considered. Such conditions are satisfied in the cases shown below. In such cases, an arbitrary vector clearly becomes the eigen vector.

(2) $\delta = m.\pi/2$ (m: an integer)

(3) $\alpha = \pi/2$ Also, $J_{12}$ is equal to zero when $\alpha = 0$. The eigen equation and the eigen value shown below obtain.

$$\begin{pmatrix} e^{-i4\delta} & 0 \\ 0 & e^{i4\delta} \end{pmatrix}\begin{pmatrix} V_x \\ V_y \end{pmatrix} = \lambda \begin{pmatrix} V_x \\ V_y \end{pmatrix} \quad \lambda = e^{-i4\delta}, e^{i4\delta}$$

Therefore, the formula $J_{11} - \lambda = 0$ obtains when the conditions shown below are satisfied. At this time, an arbitrary vector becomes the eigen vector.

(4) $\alpha = 0$ and $\delta = (2n+1).\pi/4$ (n: an integer) Also, in cases where the conditions (5) $\alpha = 0$ and $\delta \neq m.\pi/4$ (m: an integer) are satisfied, an arbitrary vector belonging to two eigen values $$V = \begin{pmatrix} V_x \\ 0 \end{pmatrix}, \begin{pmatrix} 0 \\ V_y \end{pmatrix}$$

becomes the eigen vector. Of the cases (1) through (5) studied above, the eigen vectors in the cases of (2), (3), (4), and (5) are not the solutions suitable for constructing the polarized light coherent combining laser apparatus, which comprises a plurality of lasers, as will be understood easily when the calculations similar to those described below are carried out. Therefore, only the solution in the cases of (1) will be studied hereinbelow.

The results of the calculations made above indicate that a vector V having a predetermined azimuthal angle becomes the eigen vector in cases where the phase difference plate satisfies the conditions shown below.

$$0 < |\alpha| < \frac{\pi}{2}, \delta \neq m \cdot \frac{\pi}{2} \text{ (m: an integer)},$$

and $$\cos(2\delta) = \frac{\tan(\alpha)}{\tan(2\phi)}$$

The eigen vector is expressed as $$V = \begin{pmatrix} \cos(\phi) \\ \sin(\phi) \end{pmatrix}$$

A vector, which is obtained when the eigen vector V travels through the resonator shown in FIG. 3 and arrives at the opposite mirror end face, can be expressed as the product of the Jones matrix $J_h$, which represents a half round trip of the resonator, and the eigen vector V.

$$J_h = P \times R(\alpha) \times P = \begin{pmatrix} e^{i\delta} & 0 \\ 0 & e^{i\delta} \end{pmatrix}\begin{pmatrix} \cos(\alpha) & \sin(\alpha) \\ -\sin(\alpha) & \cos(\alpha) \end{pmatrix}\begin{pmatrix} e^{-i\delta} & 0 \\ 0 & e^{i\delta} \end{pmatrix} \quad (11)$$

$$= \begin{pmatrix} e^{i2\delta}\cos(\alpha) & \sin(\alpha) \\ -\sin(\alpha) & e^{i2\delta}\cos(\alpha) \end{pmatrix}$$

$$V_h = J_h \times V = \begin{pmatrix} e^{-i2\delta}\cos(\alpha) & \sin(\alpha) \\ -\sin(\alpha) & e^{i2\delta}\cos(\alpha) \end{pmatrix} \begin{pmatrix} \cos(\phi) \\ \sin(\phi) \end{pmatrix} \quad (12)$$

$$= \begin{pmatrix} e^{-i2\delta}\cos(\alpha)\cos(\phi) + \sin(\alpha)\sin(\phi) \\ -\sin(\alpha)\cos(\phi) + e^{i2\delta}\cos(\alpha)\sin(\phi) \end{pmatrix}$$

The respective components of the vector $V_h$ have values with respect to the principal axes of the second $\lambda\delta/\pi$ plate 14B. Therefore, the ratio between the orthogonal components can be expressed with the formula $$\frac{V_{hy}}{V_{hx}} = \frac{-\sin(\alpha)\cos(\phi) + e^{i2\delta}\cos(\alpha)\sin(\phi)}{e^{-i2\delta}\cos(\alpha)\cos(\phi) + \sin(\alpha)\sin(\phi)} \quad (13)$$

The ratios between the orthogonal components in the cases shown below will hereinbelow be calculated with Formula (13).

In cases where $$0 < |\alpha| < \frac{\pi}{2}, \delta \neq m \cdot \frac{\pi}{2} \text{ (m: an integer), and}$$

$$\cos(2\delta) = \frac{\tan(\alpha)}{\tan(2\phi)}$$

A calculation with Formula (13) gives $$V_{hy}/V_{hx} = \tan(-\phi) \quad (14)$$

Figure 5:
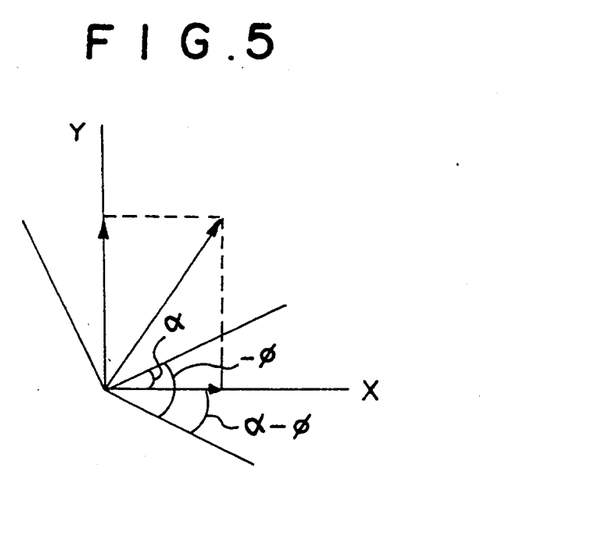
FIG. 5 is a graph showing an angle $\alpha - \phi$ of a vector with respect to an s axis of a first $\lambda\delta/\pi$ plate.
Figure 6:
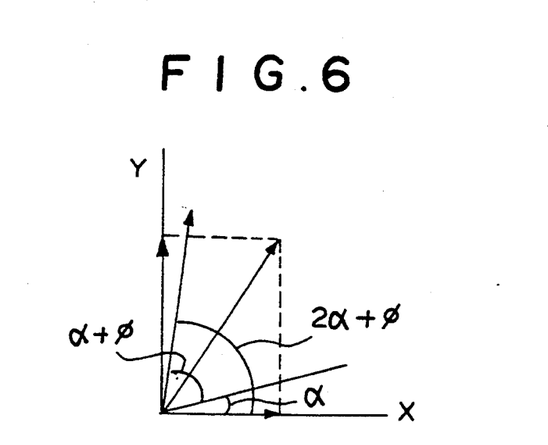
FIG. 6 is a graph showing an angle $2\alpha + \phi$ of a vector with respect to the s axis of the first $\lambda\delta/\pi$ plate.

This formula indicates that the vector in the state, in which it has arrived at the opposite mirror end face, is the linearly polarized light and makes an angle of $-\phi$ with respect to the s axis of the adjacent second $\lambda\delta/\pi$ plate 14B. Therefore, as illustrated in FIG. 5, the angle $\theta$ with respect to the s axis of the first $\lambda\delta/\pi$ plate 14A takes the value shown below.

$$\theta = \alpha - \phi \quad (15)$$

Accordingly, such that the vector in the state, in which it has arrived at the opposite mirror end face, may be directed to the directions of the two principal axes of the first $\lambda\delta/\pi$ plate 14A, the conditions shown below should be satisfied.

$$\alpha = \phi + m \cdot \pi/2 \text{ (m: an integer)} \quad (16)$$

The directions of the two principal axes and the value of m correspond to each other in the manner shown below.

When m=2n (even number):
Directed to the s (x) direction
When m=2n+1 (odd number): Directed to the f (y) direction As indicated by the aforesaid results of analysis, in general, it is possible to constitute a polarized light coherent combining laser apparatus from two lasers, which produce laser beams having different intensities. In general, the configuration of the polarized light coherent combining laser apparatus, which comprises two lasers for producing laser beams having different intensities, can be obtained by substituting the configuration of the resonator of the generalized twist mode laser, which is shown in FIG. 3, by the configuration described below.

A configuration corresponding to the eigen mode in the case described below, which is among the eigen modes described above and in which the azimuthal angle of the linearly polarized light radiated out can be controlled, will be described hereinbelow by taking the use of a plurality of lasers (where $n \geq 3$) into consideration.

In cases where $0 < |\alpha| < \pi/2$ and $\delta \neq m.\pi/2$ (m: an integer)

Figure 7:
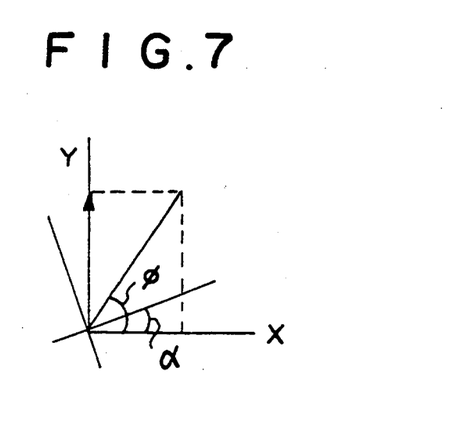
FIG. 7 is a graph showing an angle of the s axis of a $\lambda\delta/\pi$ plate with respect to the direction of P-polarization of a polarizing element.

In the configuration of the resonator of the generalized twist mode shown in FIG. 3, a polarizing element is inserted between the two $\lambda\delta/\pi$ plates 14A and 14B such that, for example, the direction of P-polarization of the polarizing element may coincide with the direction of the s axis of the first $\lambda\delta/\pi$ plate 14A. In this manner, the polarizing element and the subsequent second $\lambda\delta/\pi$ plate 14B constitute a coupling device, which achieves coupling between two lasers. At this time, the first $\lambda\delta/\pi$ plate 14A can be omitted by adjusting the positions of the lasers. The azimuthal angle of the linearly polarized light, which is radiated out of each laser, is set such that the laser beams produced by the lasers can be combined with each other by the polarizing element (this also applies to the descriptions that follow). The $\lambda\delta/\pi$ plate, which constitutes the coupling device, is set so as to satisfy the conditions shown below with respect to the polarizing element and the intensity ratio C between the P-polarized laser beam and the S-polarized laser beam, which impinge upon the polarizing element. In Formula (21), the value of $\alpha$ represents the angle of the s axis of the $\lambda\delta/\pi$ plate with respect to the direction of P-polarization of the polarizing element. (The angle is shown in FIG. 7.)

$$\phi = \tan^{-1}\sqrt{C} \quad C = \frac{I_s}{I_p} \quad (20)$$

$$\cos(2\delta) = \frac{\tan(\alpha)}{\tan(2\phi)} \quad (\alpha: \text{arbitrary}) \quad (21)$$

In this case, the light radiated out becomes the linearly polarized light. Also, such that the azimuthal angle of the linearly polarized light may be set in the direction of the P-polarized light or the S-polarized light, the rotation angle $\alpha$ of the phase difference plate is set as shown below.

$$\alpha = \phi + m\pi/2 \quad (m: \text{an integer}) \tag{22}$$

When m=2n (even number): The radiated light is directed to the direction of P-polarization.

When m=2n+1(odd number): The radiated light is directed to the direction of S-polarization.

Figures 8, 9:
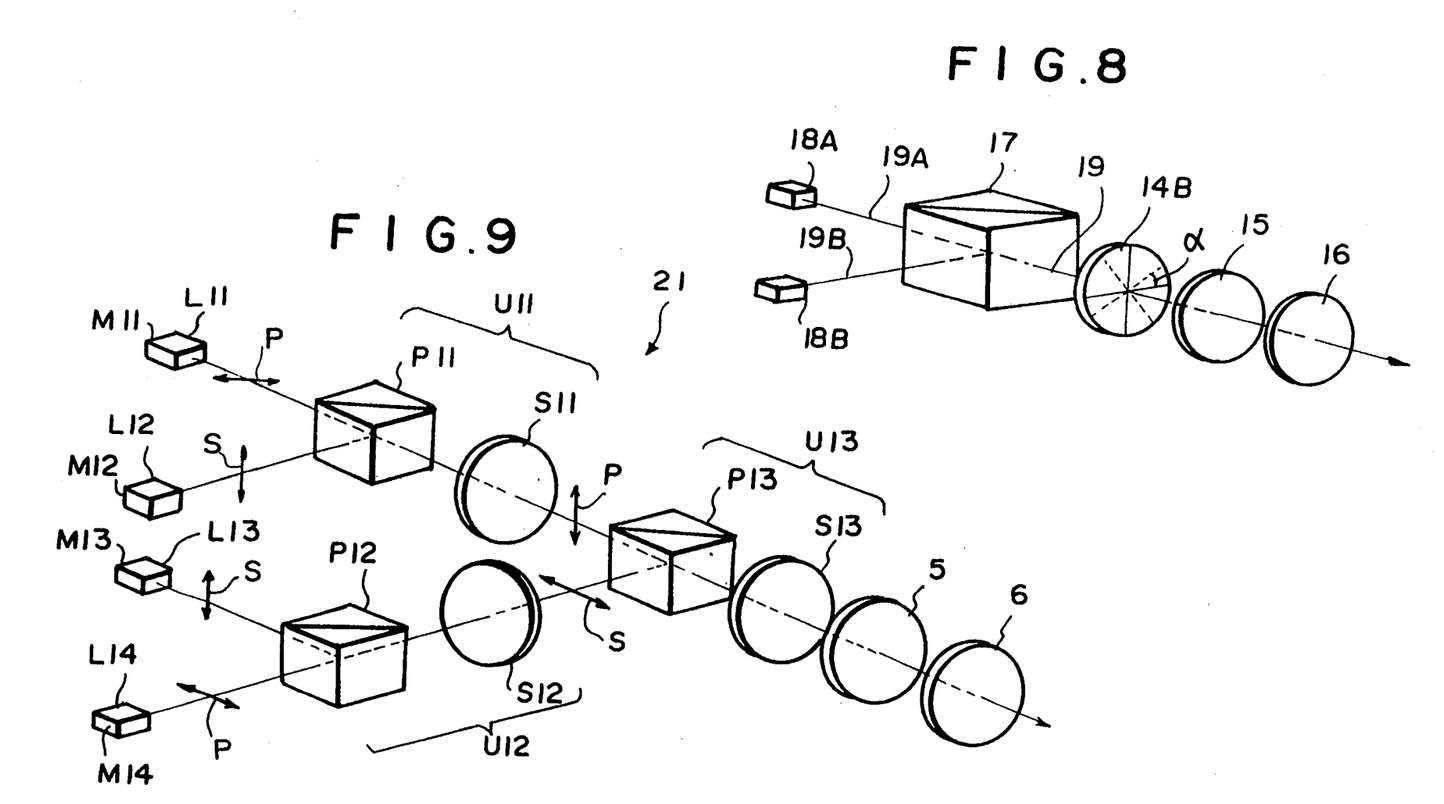
FIG. 8 is a perspective view showing a configuration of the polarized light coherent combining laser apparatus in cases where $0 < |\alpha| < \pi/2$ and $\delta \pm m.\pi/2$.
FIG. 9 is a perspective view showing a second embodiment of the polarized light coherent combining laser apparatus in accordance with the present invention.
Figure 10:
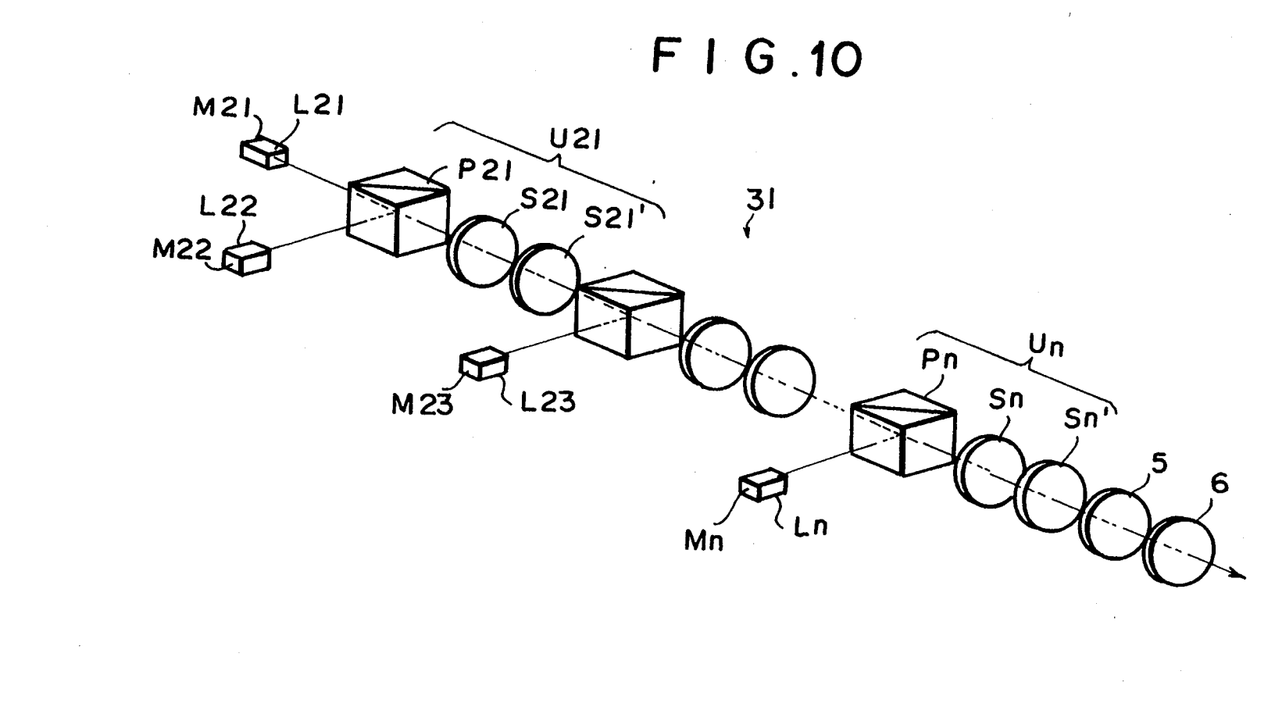
FIG. 10 is a perspective view showing a third embodiment of the polarized light coherent combining laser apparatus in accordance with the present invention.

This configuration is shown in FIG. 8.

In FIG. 8, two laser beams 19A and 19B having been produced by two laser beam sources 18A and 18B are combined with each other into a combined laser beam 19 by a polarizing beam splitter 17. A $\lambda\delta/\pi$ plate 14B, an analyzer 15, and a radiating mirror 16 are located in the optical path of the combined laser beam 19.

In order for coherent beam combination to be effected, feedback light coming from a laser is necessary. In FIG. 8, for example, on the laser beam radiating side of the polarizing element, the P-polarized light vector component $$P = \begin{pmatrix} 1 \\ 0 \end{pmatrix}$$

passes through the $\lambda\delta/\pi$ plate 14B, is reflected by the radiating mirror 16, and again passes through the $\lambda\delta/\pi$ plate 14B. The reflected vector in this state can be calculated on the same coordinate system as shown below.

$$R_p = \begin{pmatrix} \cos(2\delta) - i \cdot \sin(2\delta)\cos(2\alpha) \\ -i \cdot \sin(2\alpha)\sin(2\delta) \end{pmatrix} \tag{23}$$

Therefore, finite feedback light toward the S-polarized light is present.

Also, as for the S-polarized light vector component $$S = \begin{pmatrix} 0 \\ 1 \end{pmatrix}$$

the reflected vector can be calculated as shown below.

$$R_s = \begin{pmatrix} -i \cdot \sin(2\alpha)\sin(2\delta) \\ \cos(2\delta) + i \cdot \sin(2\delta)\cos(2\alpha) \end{pmatrix} \tag{24}$$

Therefore, finite feedback light toward the P-polarized light is present. Accordingly, coupling between the lasers is accomplished. As a result, the two laser beams to be combined oscillate coherently, and coherent beam combination can be achieved.

From the foregoing, the configuration of the polarized light coherent combining laser apparatus, which comprises a plurality of lasers (where n≧3), is considered as described below.

The polarized light coherent combining laser apparatus, which comprises a plurality of lasers (where n≧3), can be obtained by connecting the configurations of the aforesaid generalized polarized light coherent combining laser apparatuses in series. The optical system on the laser beam radiating side of the first coupling device, which is constituted of the polarizing element and the phase difference plate, can be regarded as being equivalent to the system, which is constituted of a single analyzer in a predetermined direction and a single mirror having a predetermined reflectivity. (In embodiments described below, the polarizing element next to the first coupling device serves as the analyzer.) Therefore, the first laser and the second laser oscillate coherently, and the light radiated out of the first coupling device can be regarded as a single laser beam. Also, as for the second coupling device, the light radiated out of the second coupling device can be regarded as a single laser beam. The same thing applies to the systems that follow, and the whole system oscillates as a single polarized light coherent combining laser apparatus.

How the polarized light coherent combining laser apparatus, which comprises a plurality of lasers (where n≧3), is constructed will be described hereinbelow. In cases where a plurality of polarizing elements are connected in series, the directions of polarization of the respective polarizing elements should preferably coincide with one another. Therefore, a configuration, wherein the configurations of the aforesaid generalized polarized light coherent combining laser apparatuses are connected in series, will be described hereinbelow. In the aforesaid generalized polarized light coherent combining laser apparatuses, the azimuthal angle of the linearly polarized light having been radiated out of each coupling device is directed to the direction of P- or S-polarization of the polarizing element. The setting of the coordinate system, or the like, is carried out in the same manner as that described above.

$0 < |\alpha_i| < \pi/2$ and $\delta_i \pm m_i \cdot \pi/2$ (mi: an integer) (where i represents the i'th unit, this also applies to the descriptions that follow)

In the i'th coupling device, which comprises the polarizing element and the phase difference plate, the values of $\alpha_i$ and $\delta_i$ satisfying the conditions shown below are set for the phase difference plate. In the formulas shown below, $C_i$ represents the intensity ratio of the S-polarized laser beam impinging upon the polarizing element to the P-polarized laser beam impinging upon the polarizing element.

$$\phi_i = \tan^{-1}\sqrt{C_i} \quad C_i = \frac{I_{si}}{I_{pi}} \tag{25}$$

$$\cos(2\delta_i) = \frac{\tan(\alpha_i)}{\tan(2\phi_i)} \tag{26}$$

$$\alpha_i = \phi_i + m_i \cdot \frac{\pi}{2} \quad (m_i: \text{an integer}) \tag{27}$$

where $m_i=2n_i$ (even number) for a configuration, in which the polarizing element at the next stage transmits the P-polarized laser beam and combines it with the other laser beam, and $m_i=2n_i+1$ (odd number) for a configuration, in which the polarizing element at the next stage reflects the S-polarized laser beam and combines it with the other laser beam.

The conditions shown above serve as the conditions for the phase difference plates S1 through Sn, which constitute the polarized light coherent combining laser apparatus shown in FIG. 1. In FIG. 1, the polarizing element located next to each coupling device also serves as the analyzer. In this embodiment, if the intensities of the respective laser beams are identical with one another, the intensity ratio $C_i$ of the S-polarized laser beam impinging upon the i'th coupling device to the P-polarized laser beam impinging upon the i'th coupling device takes the value shown below.

$C_i = 1/i$

The polarized light coherent combining laser apparatus 1 shown in FIG. 1 is obtained by combining n number (where $n \geq 3$) of units 10, 10, ..., each of which is provided with the phase difference plate satisfying the aforesaid conditions for the phase difference $\delta_i$ and the predetermined angle $\alpha_i$ as shown in FIG. 2. How the polarized light coherent combining laser apparatus 1 shown in FIG. 1 is constructed will hereinbelow be described in more detail. In this embodiment, the positions of the respective semiconductor lasers are adjusted such that the laser beams impinging upon each unit may have an appropriate phase difference.

As illustrated in FIG. 1, laser beams, which have been produced by two semiconductor lasers L1 and L2, impinge upon a first unit U1, which comprises a polarizing beam splitter P1 and a phase difference plate S1. Also, a laser beam, which has been radiated out of the first unit U1, and a laser beam, which has been radiated out of a semiconductor laser L3, impinge upon a second unit U2, which comprises a polarizing beam splitter P2 and a phase difference plate S2. In this manner, n number of units U1 through Un are located. An analyzer 5 and a radiating mirror 6 are located in the optical path of the laser beam, which has been radiated out of the n'th unit Un, and the polarized light coherent combining laser apparatus 1 is thereby constructed. Specifically, all of the laser beams, which have been radiated out of the respective semiconductor lasers L1 through Ln, are optically directed to the radiating mirror 6.

The surface of the radiating mirror 6, which surface stands facing each unit, is provided with a coating film such that the reflectivity may fall within the range of approximately 2% to approximately 5%. Mirror surfaces M1′, M2′, ..., Mn′ of the semiconductor lasers L1 through Ln, which mirror surfaces stand facing the respective units, are in the anti-reflecting state. Also, surfaces M1, M2, ..., Mn of the semiconductor lasers L1 through Ln, which surfaces are opposite to the mirror surfaces M1′, M2′, ..., Mn′, are provided with coating films such that the reflectivity may be approximately 90%. Each of the semiconductor lasers L1 through Ln is located such that an active layer sandwiched between cladding layers may be directed horizontally in FIG. 1. Further, each of the phase difference plates S1 through Sn has the aforesaid phase difference $\delta_i$ and the aforesaid angle of inclination $\alpha_i$ of the principal axes. When the laser beam having impinged upon each of the phase difference plates S1 through Sn passes therethrough, it is radiated out as a P-polarized laser beam, i.e. as a linearly polarized laser beam having the plane of polarization in the directions indicated by the double headed arrow P in FIG. 1 with respect to the incidence surface of each of the polarizing beam splitters P1 through Pn.

Also, the analyzer 5 is located in the optical path of the laser beam, which has been radiated out of the unit Un at the last stage. The analyzer 5 is constituted of a Glan-Thompson polarizing prism, or the like. The analyzer 5 transmits only the component of the laser beam having been radiated out of the unit Un, which component has been polarized linearly in a predetermined direction, toward the radiating mirror 6. Also, the analyzer 5 transmits only the component of the laser beam having been reflected by the radiating mirror 6, which component has been polarized linearly in a predetermined direction, toward the unit Un.

The plane of polarization of the laser beam, which has been reflected toward the unit Un, is rotated by each of the phase difference plates S1 through Sn of the respective units in accordance with the phase difference $\delta_i$ and the rotation angle $\alpha_i$ of the principal axes of each phase difference plate. Also, the laser beam is split by each polarizing beam splitter into a P-polarized laser beam and an S-polarized laser beam.

How this embodiment works will be described hereinbelow.

A voltage is applied across the cladding layers of each of the semiconductor lasers L1 through Ln, and the laser beam is thereby produced. As for the unit U1, the laser beam, which has been produced by the semiconductor laser L1, is a P-polarized laser beam. The laser beam, which has been produced by the semiconductor laser L2, is an S-polarized laser beam. The polarizing beam splitter P1 transmits the P-polarized laser beam therethrough and reflects the S-polarized laser beam. Therefore, the two laser beams impinging upon the polarizing beam splitter P1 are combined coherently into a laser beam in a single polarized state. The combined laser beam impinges upon the phase difference plate S1. The phase difference plate S1 has the phase difference $\delta_1$ in accordance with the intensity ratio of the S-polarized laser beam, which has been radiated out of the semiconductor laser L2, to the P-polarized laser beam, which has been radiated out of the semiconductor laser L1. The phase difference plate S1 also has the predetermined rotation angle $\alpha_1$ of the principal axes with respect to the planes of polarization of the laser beams. Therefore, the plane of polarization of the laser beam impinging upon the phase difference plate S1 is rotated by a predetermined angle in accordance with the phase difference $\delta_1$ and the rotation angle $\alpha_1$. As a result, the laser beam is radiated as the P-polarized laser beam out of the phase difference plate S1. The P-polarized laser beam, which has been radiated out of the phase difference plate S1, impinges upon the polarizing beam splitter P2 of the next unit U2.

In the unit U2, the P-polarized laser beam, which has been received from the unit U1, and the S-polarized laser beam, which has been produced by the semiconductor laser L3, are combined with each other. The plane of polarization of the combined laser beam is rotated by a predetermined angle in accordance with a phase difference $\delta_2$ and a rotation angle $\alpha_2$ of the phase difference plate S2. As a result, the laser beam is radiated as the P-polarized laser beam out of the phase difference plate S2. The P-polarized laser beam, which has been radiated out of the phase difference plate S2, impinges upon the next unit U3.

The processes described above are repeated up to the unit Un, and a laser beam is radiated out of the unit Un at the last stage. The component of the laser beam having been radiated out of the unit Un, which component has been polarized linearly in the predetermined direction, passes through the analyzer 5, is reflected by the radiating mirror 6, and again impinges upon the unit Un. The plane of polarization of the laser beam impinging upon the unit Un is rotated by the phase difference plate Sn of the unit Un, and the laser beam impinges upon the polarizing beam splitter Pn. The polarizing beam splitter Pn transmits only the P-polarized light component of the incident laser beam therethrough, and the alternating multi-layer film of the polarizing beam splitter Pn reflects the S-polarized light component. Therefore, the P-polarized light component of the laser beam, which has impinged upon the polarizing beam splitter Pn, goes to the unit U(n-1), and the S-polarized light component of the laser beam is reflected to the semiconductor laser Ln. The S-polarized light component, which has impinged upon the semiconductor laser Ln, is reflected by the mirror surface Mn, again impinges upon the polarizing beam splitter Pn, and is then reflected by the polarizing beam splitter Pn.

The plane of polarization of the P-polarized light component of the laser beam, which has impinged upon the unit U(n-1), is rotated by a predetermined angle by the phase difference plate S(n-1) of the unit U(n-1). The laser beam then impinges upon the polarizing beam splitter P(n-1). In the same manner as that in the polarizing beam splitter Pn, the polarizing beam splitter P(n-1) transmits only the P-polarized light component of the incident laser beam therethrough and reflects the S-polarized light component. Therefore, the P-polarized light component of the laser beam, which has impinged upon the polarizing beam splitter P(n-1), goes to the unit U(n-2), and the S-polarized light component of the laser beam is reflected to the semiconductor laser L(n-1). The S-polarized light component, which has impinged upon the semiconductor laser L(n-1), is reflected by the mirror surface M(n-1), again impinges upon the polarizing beam splitter P(n-1), and is then reflected by the polarizing beam splitter P(n-1). The processes described above are repeated up to the unit U1, and the P-polarized laser beam and the S-polarized laser beam are radiated out of the unit U1. The P-polarized laser beam and the S-polarized laser beam, which have been radiated out of the unit U1, are respectively reflected by the mirror surfaces M1 and M2 of the semiconductor lasers L1 and L2 and again impinge upon the polarizing beam splitter P1.

The P-polarized laser beam and the S-polarized laser beam, which have again impinged upon the polarizing beam splitter P1, are again combined with each other in the same manner as that described above. The combined laser beam is converted by the phase difference plate S1 into the P-polarized laser beam. The P-polarized laser beam, which has thus been obtained, again impinges upon the polarizing beam splitter P2 of the unit U2 and is combined with the S-polarized light component of the laser beam, which has been reflected by the mirror surface M3. The combined laser beam, which has thus been obtained, impinges upon the next unit U3. The laser beam, which has been ultimately radiated out of the unit Un, passes through the analyzer 5 and is reflected by the radiating mirror 6. Thereafter, the laser beam again impinges upon the unit Un, and the same processes as those described above are carried out.

In the manner described above, the laser beams, which have been produced by the semiconductor lasers L1 through Ln, are repeatedly reflected between the mirror surfaces M1 through Mn of the semiconductor lasers L1 through Ln and the reflecting surface of the radiating mirror 6 and amplified by the active layers of the semiconductor lasers L1 through Ln. The P-polarized light component and the S-polarized light component of the laser beams are repeatedly reflected in association with the corresponding semiconductor lasers L1 through Ln, which produced the P-polarized light component or the S-polarized light component, by the effects of the analyzer 5 and the phase difference plates S1 through Sn. Therefore, the P-polarized light component and the S-polarized light component are coherently combined with each other by the optical resonator, which is constituted of the reflecting surface of the radiating mirror 6 and the mirror surfaces M1 through Mn of the semiconductor lasers L1 through Ln.

When the intensity of the combined laser beam reaches a predetermined value, the combined laser beam passes through the radiating mirror 6 and is radiated in a single polarized state out of the polarized light coherent combining laser apparatus. Each of the semiconductor lasers L1 through Ln is located such that the active layer may be directed horizontally (i.e., in the direction of P-polarization) in FIG. 1. Therefore, in cases where a λ/2 plate is located in the optical path of the laser beam, which has been radiated out of the semiconductor laser L1, and the direction of polarization is rotated by an angle of 90 degrees, the laser beams are combined with each other such that the major axes of the cross-sectional shapes of the respective laser beams may extend vertically, and the ellipses may overlap one upon the other. Also, in order for the laser beams to be combined such that the directions of polarization may intersect perpendicularly to each other, the semiconductor laser L1 may be located such that its active layer may be directed in the direction intersecting perpendicularly to the directions of the active layers of the semiconductor lasers L2 through Ln. The laser beam having passed through the radiating mirror 6 is radiated as the linearly polarized laser beam by the effects of the analyzer 5.

In cases where a phase difference is present between the laser beams having been produced by the respective semiconductor lasers, a phase difference plate may be located at the position prior to the polarizing beam splitter in order to compensate for the phase difference.

In the aforesaid first embodiment of the polarized light coherent combining laser apparatus in accordance with the present invention, the units are located in series. In cases where the intensities of the laser beams impinging upon the respective units are identical with one another, a second embodiment shown in FIG. 9 may be employed. The second embodiment of the polarized light coherent combining laser apparatus in accordance with the present invention will be described hereinbelow.

As illustrated in FIG. 9, in a polarized light coherent combining laser apparatus 2, laser beams having an identical intensity are produced by two semiconductor lasers L11 and L12. The laser beams, which have been produced by the semiconductor lasers L11 and L12, impinge upon a first unit U11, which comprises a polarizing beam splitter P11 and a phase difference plate S11. Also, laser beams, which have the identical intensity and have been produced by two semiconductor lasers L13 and L14, impinge upon a second unit U12, which comprises a polarizing beam splitter P12 and a phase difference plate S12. Further, the laser beams, which have the identical intensity and have been radiated out of the first unit U11 and the second unit U12, impinge upon a third unit U13, which comprises a polarizing beam splitter P13 and a phase difference plate S13. The semiconductor lasers L11 and L14 produce the P-polarized light component. The semiconductor lasers L12 and L13 produce the S-polarized light component.

In this embodiment, the intensities of the P-polarized laser beam and the S-polarized laser beam impinging upon the respective units are identical with each other. Therefore, from Formulas (25), (26), and (27), the phase difference $\delta_i$ and the rotation angle $\alpha_i$ are determined as shown below.

$\alpha_1 = \pi/4$, $\delta_1 = \pi/4$
$\alpha_2 = \pi/4$, $\delta_2 = \pi/4$
$\alpha_3 = \pi/4$, $\delta_3 = \pi/4$ How the second embodiment works will be described hereinbelow.

The P-polarized laser beam and the S-polarized laser beam, which have been produced respectively by the semiconductor lasers L11 and L12, are combined with each other by the polarizing beam splitter P11. The plane of polarization of the combined laser beam is rotated by the phase difference plate S11, and the resulting laser beam impinges upon the unit U13. Also, the S-polarized laser beam and the P-polarized laser beam, which have been produced respectively by the semiconductor lasers L13 and L14, are combined with each other by the polarizing beam splitter P12. The plane of polarization of the combined laser beam is rotated by the phase difference plate S12, and the resulting laser beam impinges upon the unit U13. In the unit U13, the laser beams coming from the units U11 and U12 are combined with each other. The plane of polarization of the combined laser beam is rotated by the phase difference plate S13, and the resulting laser beam is radiated out of the unit U13. In the same manner as that in the first embodiment described above, the component of the laser beam having been radiated out of the unit U13, which component has been polarized linearly in the predetermined direction, passes through the analyzer 5, is reflected by the radiating mirror 6, and again impinges upon the unit U13.

Thereafter, in the same manner as that in the first embodiment described above, the laser beam, which has again impinged upon the unit U13, is split into two laser beams. The two split laser beams impinge respectively upon the units U11 and U12. Thereafter, the laser beams are reflected by mirror surfaces M11, M12, M13, and M14 of the semiconductor lasers L11, L12, L13, and L14 and again impinge upon the units U11, U12, and U13. In this manner, the laser beams, which have been produced by the semiconductor lasers L11, L12, L13, and L14, are repeatedly reflected between the mirror surfaces M11, M12, M13, and M14 of the semiconductor lasers L11, L12, L13, and L14 and the reflecting surface of the radiating mirror 6 and amplified by the active layers of the semiconductor lasers L11, L12, L13, and L14. Therefore, in the same manner as that in the first embodiment described above, the P-polarized laser beams and the S-polarized laser beams, which have been produced by the semiconductor lasers L11, L12, L13, and L14, are coherently combined with one another.

What is claimed is:

1. A polarized light coherent combining laser apparatus, comprising:
   i) a plurality of units, each of which comprises:
      a) a polarizing element for combining a P-polarized laser beam and an S-polarized laser beam, which impinge upon said polarizing element and have a predetermined intensity ratio with respect to each other, with each other into a single combined laser beam and radiating out the combined laser beam,
      said polarizing element also splitting a single laser beam, which impinges upon the polarizing element from a direction reverse to the direction along which the single combined laser beam was radiated out of said polarizing element, into a P-polarized laser beam and an S-polarized laser beam and radiating out the split P-polarized and S-polarized laser beams respectively in directions reverse to the directions, along which the two laser beams to be combined with each other by said polarizing element impinged upon said polarizing element, and
      b) a phase difference plate, which is located in the optical path of the single combined laser beam having been radiated out of said polarizing element, and which has a phase difference in accordance with the intensity ratio of the S-polarized laser beam impinging upon said polarizing element to the P-polarized laser beam impinging upon said polarizing element and has principal axes inclined by a predetermined angle with respect to the P-polarized laser beam and the S-polarized laser beam,
   the plurality of said units being located such that a laser beam having been radiated out of each unit may impinge upon the polarizing element of a unit, which is located at the next stage, together with the other laser beam, which is to be combined with said laser beam having been radiated out of each unit,
   ii) an analyzer, which is located in the optical path of the laser beam having been radiated out of a unit at a last stage among the plurality of said units, and which transmits a predetermined polarized light component of the laser beam having been radiated out of the unit at the last stage,
   iii) a radiating reflecting mirror for reflecting the laser beam, which has been radiated out of said analyzer, in a predetermined proportion,
   iv) amplifying media for amplifying incident laser beams, each of said amplifying media being located in the optical path of a laser beam, which is one of the laser beams impinging upon each of the plurality of said units and which is other than the laser beam coming from a preceding unit, and
   v) reflecting mirrors respectively provided on said amplifying media, each of said reflecting mirrors reflecting the laser beam, which has been reflected by said radiating reflecting mirror to the corresponding amplifying medium and has then passed through the corresponding amplifying medium, in a direction heading towards said radiating reflecting mirror,
   the phase difference and the angle of inclination of the principal axes of said phase difference plate of each unit being set such that, in cases where $0 < |\alpha_i| < \pi/2$ and $\delta_i \pm m_i \cdot \pi/2$, wherein $\alpha_i$ represents the angle of inclination of the principal axes of the phase difference plate of an i'th unit, as counted from the unit at the first stage among the plurality of said units, $\delta_i$ represents the phase difference of the phase difference plate of the i'th unit, and $m_i$ is an integer, the angle of inclination $\alpha_i$ of the principal axes and the phase difference $\delta_i$ satisfy the conditions $$\phi_i = \tan^{-1} \sqrt{c_i}$$

$$\alpha_i = \phi_i + m_i \cdot \pi/2$$

where $m_i = 2n_i$ ($n_i$: an integer) for a configuration, in which the polarizing element at the next stage transmits a P-polarized laser beam having been radiated out of the i'th unit and combines it with the other laser beam, and $m_i = 2n_i + 1$ (ni: an integer) for a configuration, in which the polarizing element at the next stage reflects an S-polarized laser beam having been radiated out of the i'th unit and combines it with the other laser beam, and $$\cos 2\delta_i = \tan \alpha_i / \tan 2\phi_i$$

wherein $C_i$ represents the intensity ratio $Is_i/Ip_i$, $Is_i$ represents the intensity of the S-polarized laser beam impinging upon the i'th unit, and $Ip_i$ represents the intensity of the P-polarized laser beam impinging upon the i'th unit.

2. An apparatus as defined in claim 1 wherein said amplifying media are semiconductor lasers.

3. An apparatus as defined in claim 1 wherein said polarizing element is a polarizing beam splitter.

* * * * *